United States Patent

Moelle et al.

(10) Patent No.: US 7,641,773 B2
(45) Date of Patent: Jan. 5, 2010

(54) PROCESS FOR PRODUCING LAYERS AND LAYER SYSTEMS, AND COATED SUBSTRATE

(75) Inventors: Christoph Moelle, Bad Gandersheim (DE); Lars Bewig, Bad Gandersheim (DE); Frank Koppe, Bad Gandersheim (DE); Thomas Kuepper, Bad Gandersheim (DE); Stefan Geisler, Sarstedt (DE); Stefan Bauer, Alzey (DE)

(73) Assignee: Schott AG, Mainz (DE)

( * ) Notice: Subject to any disclaimer, the term of this patent is extended or adjusted under 35 U.S.C. 154(b) by 492 days.

(21) Appl. No.: 10/527,499

(22) PCT Filed: Sep. 13, 2003

(86) PCT No.: PCT/EP03/10222

§ 371 (c)(1),
(2), (4) Date: Sep. 28, 2005

(87) PCT Pub. No.: WO2004/026787

PCT Pub. Date: Apr. 1, 2004

(65) Prior Publication Data

US 2006/0093840 A1    May 4, 2006

(30) Foreign Application Priority Data

Sep. 14, 2002  (DE) ............................... 102 42 848

(51) Int. Cl.
    *C23C 14/34* (2006.01)
(52) U.S. Cl. .................. 204/192.1; 204/192.23; 204/192.12; 204/192.15; 204/192.26; 204/192.27; 204/298.28; 204/298.02; 204/298.12; 204/298.16; 204/298.19; 204/298.23

(58) Field of Classification Search .............. None
    See application file for complete search history.

(56) References Cited

U.S. PATENT DOCUMENTS

| 4,900,630 A | 2/1990 | Suzuki et al. | 428/432 |
| 5,705,277 A | 1/1998 | Marcquart et al. | 428/428 |
| 5,944,964 A | 8/1999 | Solberg et al. | 204/192.26 |

FOREIGN PATENT DOCUMENTS

| EP | 0 516 436 A2 | 12/1992 |
| EP | 0 548 972 A1 | 6/1993 |
| JP | 58147556 | 9/1983 |
| JP | 05-116993 | 5/1993 |

OTHER PUBLICATIONS

Translation of JP 58-147556.*
XP002911055—Evolution of surface roughness and scatter in evaporated zirconia/silica multilayer coatings, Klinger and Swab, Optical Coating Laboratory, Inc., Spie vol. 678 Optical Thin Films II, New Developments (1986), pp. 41-50.

* cited by examiner

*Primary Examiner*—Ling Xu
(74) *Attorney, Agent, or Firm*—Ohlandt, Greeley, Ruggiero & Perle, L.L.P.

(57) ABSTRACT

A method of producing substrates with functional layers which have high optical properties and/or a high surface smoothness, in particular a low turbidity and significantly lower roughness, is provided. The method includes a sputtering process for coating a substrate with at least one functional layer, the sputtering process being interrupted at least once by the application of an intermediate layer with a thickness of less than 20 nm.

15 Claims, 2 Drawing Sheets

PROCESS FOR PRODUCING LAYERS AND LAYER SYSTEMS, AND COATED SUBSTRATE

BACKGROUND OF THE INVENTION

1. Field of the Invention

The invention relates to a process for producing a layer system with high-quality optical properties and/or a high surface smoothness, and to coated substrates with high-quality optical properties and/or a high surface smoothness.

2. Description of Related Art

Processes for coating substrates with in particular optical layers to produce optical components, such as for example mirrors or reflectors, have long been known. The optical layers have a very wide range of functions in terms of their effect on the radiation within a defined region of the electromagnetic spectrum.

Processes for coating substrates with in particular optical layer systems which are composed of a plurality of individual functional layers, in particular of alternately arranged layers with high and low refractive indices, have likewise been known for years for a wide range of applications. In this context, the layer systems often act as a light interference film, the optical properties of which are determined by the choice of material for the layers with high and low refractive indices and therefore of the corresponding refractive indices, by the arrangement of the individual layers and by the choice of the individual layer thicknesses. The choice is made substantially on the basis of known optical design rules and design tools according to the desired optical properties and also the processing properties.

In recent years, PVD (physical vapor deposition) processes and CVD (chemical vapor deposition) processes have become the main processes used to produce layers and layer systems, in particular for optical layers and layer systems.

CVD processes are used to produce layers of refractory and other metals, carbides, nitrides and oxides. The advantage that it is possible to apply a large number of materials of virtually any theoretical density and a good bonding strength uniformly and with a high level of purity is offset by the disadvantage that suitable reactions do not exist for every desired layer material, the substrate has to be able to withstand the generally high reaction temperature and also has to be chemically stable with respect to the reactant. In general, the pressures which are required during the reaction are from 10 to 100 Pa, and consequently the free path length of the particles is relatively short and the coating rates are not optimal for industrial processes.

Nowadays, by contrast, the PVD processes, in particular sputtering processes, are distinguished by the fact that a wide range of coatable substrate materials are possible, that there is a virtually unlimited choice of coating materials, that the substrate temperature can be selected as desired, that the layer bonding is excellent and that it is easy to influence the microstructure of the layers by selecting the process parameters. The drawbacks of the sputtering processes which were originally developed have been substantially eliminated by extensive development work, and consequently nowadays sputtering technology is among the most universal and widespread coating processes.

In recent years, the use and further development of magnetron sputtering sources has meant that in particular the magnetron sputtering processes have proven suitable for industrial coating processes. The magnetron sputtering processes allow high coating rates in a low pressure range (down to under 0.1 Pa) with little heating of the substrate.

The procedure used in sputtering is fundamentally known to the person skilled in the art.

Substrates are coated by cathode atomization, preferably by magnetron cathode atomization, by means of a sputtering apparatus as described, for example, in DE 41 06 770. Targets, as they are known, of the layer starting material are exposed to the action of a plasma cloud which forms between two electrodes, with the target simultaneously forming the cathode. The atomized target material has an affinity for the reactive gas and, by forming a chemical compound with the latter, is deposited as a layer on the substrate.

EP 0 516 436 B1 has described a magnetron sputtering installation for coating a substrate with one or more layers.

The specific form of the installation contributes to a more efficient sputtering process. For this purpose, the installation has a vacuum chamber in which a substrate holder in drum form and, at the walls of the vacuum chamber, targets of the layer starting materials are located, the targets being arranged on magnetrons.

Rotation of the drum on which the substrates are located causes the substrates to be uniformly coated. This form of sputtering also allows the substrates to be coated with a plurality of layers without having to be taken out of the vacuum chamber, and the thickness of the layer is simple to influence.

However, it has been found that the known sputtering processes for coating substrates with in particular optical layers and layer systems still lead to quality problems in the form of turbidity and relatively extensive roughness of the layer surfaces, which can generally be recognized as regions with diffuse light scattering when the coated substrate is illuminated. In addition to having a purely cosmetic effect, turbidity also reduces the reflectance of the coating and therefore the quality of reflection optics. In the case of filter optics, this turbidity leads to a reduction in the transmittance. In both cases, in addition to the effect of light scattering, increased absorption can also contribute to reducing the product quality.

BRIEF SUMMARY OF THE INVENTION

Therefore, the invention is based on the object of providing a process for coating substrates which can be used to apply layers and layer systems which have a high optical quality and/or a high surface smoothness, and of providing coated substrates with a high optical quality and/or a high surface smoothness.

This object is very surprisingly achieved by a process as described herein and a coated substrate as described herein.

Accordingly, the process according to the invention for coating a substrate with at least one functional layer comprises the steps of providing a substrate in a vacuum system and providing the layer starting material in this vacuum system, and coating the substrate by means of sputtering of the layer starting material, wherein the sputtering process for coating the substrate with the functional layer is interrupted at least once by the application of an intermediate layer which is very thin compared to the functional layer, is different than the functional layer and remains below a thickness of 20 nm.

The term sputtering is used to describe processes in which the layer starting materials, which are in solid form as a target, are exposed to the bombardment of ions, so that atoms, atom clusters or molecules of the target are emitted and as a result the layer starting material is atomized.

The functional layers, as they are referred to below in the present text, may be individual layers of a coating which are optically active (i.e. they have a function in terms of their effect on the radiation within a defined region of the electromagnetic spectrum). In this case, the coating may comprise just one functional layer or a plurality of functional layers, for example an interference layer system made up of functional layers with a high refractive index and a low refractive index.

The process described here for coating a substrate with at least one functional layer advantageously does not influence either the design of known installations or the known sputtering processes per se, but rather represents a new process sequence used for the production of functional layers, with the result that the quality thereof can be significantly improved. This does not require any changes to be made to installations which are known per se, but rather merely reorganizes the process sequence in accordance with the process according to the invention using means which are known per se. The process is not restricted to specific sputtering installations, but rather can be transferred to any form of installation which allows the sputtering of layer starting materials.

Magnetron sputtering has proven particularly advantageous, since it is possible to achieve higher sputtering rates than with other sputtering processes and therefore there is an economic benefit.

In an advantageous embodiment, the substrate is coated in such a manner that functional layers with a low refractive index and functional layers with a high refractive index are applied alternately by means of sputtering in a reactive atmosphere. In this case, the functional layers with a low refractive index preferably consist of $SiO_2$ and the functional layers with a high refractive index preferably consist of $ZrO_2$, since these materials are particularly suitable for optical interference systems.

The inventors have discovered that it is possible to achieve functional layers of significantly reduced turbidity if the functional layers with a high refractive index formed from $ZrO_2$ are interrupted by very thin intermediate layers with a low refractive index formed from $SiO_2$.

Depending on the thickness of the functional layer, these intermediate layers have a thickness of 0.1 nm-20 nm, preferably 0.5 nm-10 nm, particularly preferably 1 nm-3 nm, and are optically inactive, i.e. in any event they remain below a thickness at which they cause any significant changes to the spectral curve within the region of the electromagnetic spectrum which is under consideration.

The functional layers produced using this process appear more brilliant and smoother and increase the transmittance and/or reflectance.

The process according to the invention is also suitable for coating a substrate with a metal layer, in particular a functional layer of chromium. In this case, the functional layer of metal, in particular of chromium, is interrupted by the introduction of an oxygen-rich microwave plasma, which can be generated by means of a microwave applicator. In this case, the process of sputtering pure metal targets or the Cr targets is briefly interrupted and the microwave applicator activated, which leads to oxygen being introduced into the vacuum. This oxygen reacts with the metal layer which has already been applied to the substrate, to form a thin metal oxide layer, and therefore forms a very thin intermediate layer. The sputtering of the metal or chromium target is then continued. Layers produced in this manner have a significantly smoother surface, which likewise contributes to better optical properties, and is also of benefit for further processing.

The inventors have discovered that this process leads to the measured roughness of a surface of a chromium layer produced using this process being only half the roughness, measured in the case of a polished stainless steel template, a previously preferred process for producing highly polished electrically conductive surfaces.

Each of the abovementioned coating operations can be repeated any desired number of times in order to obtain a plurality of functional layers with intermediate layers; it is not necessarily imperative for each functional layer to be interrupted by means of an intermediate layer.

It is advantageous for the substrates to be fitted to a drum which is located within the vacuum chamber and to rotate past the targets comprising the layer starting materials and past the oxygen source. This ensures homogenous coating.

It is obvious to the person skilled in the art that it is also possible for other suitable apparatuses to be used for the coating operation.

In addition to the process according to the invention, the invention also encompasses a coated substrate having at least one functional layer formed from a metal, in which the functional layer is interrupted at least once by an intermediate layer, the intermediate layer consisting of a metal oxide and remaining at a thickness of less than 10 nm.

In particular for substrates whose functional layer is a chromium layer, it has proven beneficial to the smoothness of the surface for this functional layer to be interrupted by means of an intermediate layer of a metal oxide, in particular by means of a chromium oxide layer.

Substrates which have been coated with chromium in this manner are used, for example, as substrates for lithographic processes.

A further coated substrate according to the invention is intended for use as an optical element, such as for example a color filter, for digital projection.

The coating of the substrate in this case comprises at least one functional layer of a metal oxide, and at least one intermediate layer of a metal oxide which interrupts the functional layer. In this case, the thickness of the intermediate layer remains below a thickness at which it is optically active.

The individual functional layers are preferably functional layers with a low refractive index and functional layers with a high refractive index, the functional layers being interrupted by at least one intermediate layer of a metal oxide. In this case, an intermediate layer with a low refractive index formed from $SiO_2$ is introduced into a functional layer with a high refractive index formed from $ZrO_2$.

Since coatings of substrates configured in this manner have the abovementioned good optical properties, they are used in numerous sectors.

Substrates which have been coated in this manner are not tied to known sputtering processes, and it is also conceivable for them to be produced using other processes, for example using CVD processes.

The processes disclosed here merely represent possible advantageous processes by means of which coated substrates according to the invention can be produced.

BRIEF DESCRIPTION OF THE SEVERAL VIEWS OF THE DRAWINGS

The invention is explained in more detail below on the basis of preferred embodiments and with reference to the appended figures, in which identical reference symbols denote identical or similar parts. In the drawings.

The illustrations are not to scale; the thickness of the layers and the ratio of the layer thicknesses with respect to one another can in principle be selected as desired for the particular application.

DETAILED DESCRIPTION OF THE INVENTION

Figure 1:
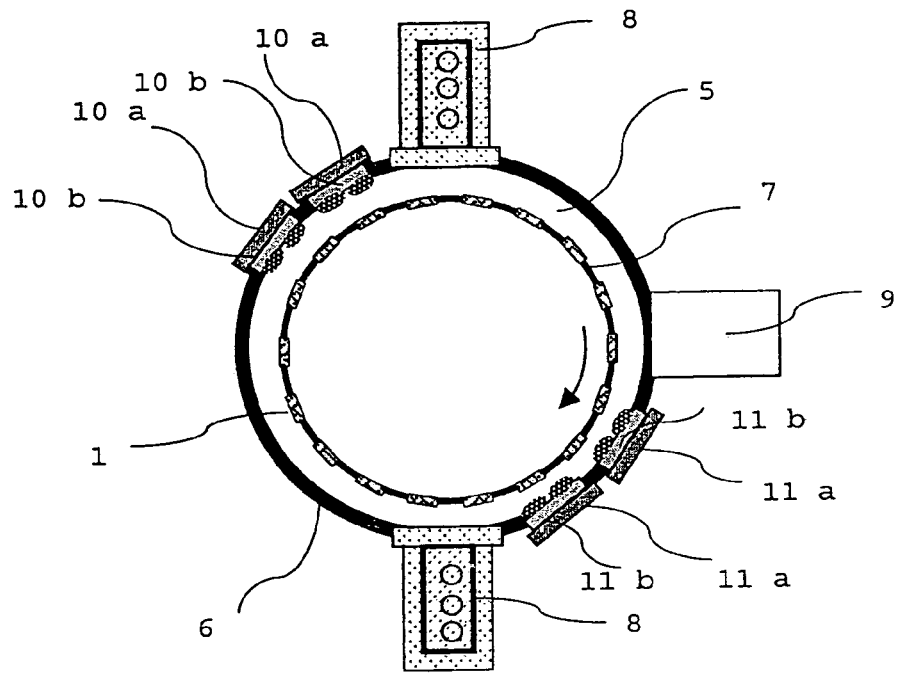
FIG. 1 diagrammatically depicts a magnetron sputtering device for coating substrates with $SiO_2$ and/or $ZrO_2$.

FIG. 1 shows a diagrammatically illustrated magnetron sputtering device which can be used for the coating of substrates with functional layers with high and low refractive indices.

The basic structure of a magnetron sputtering device of this type is known from EP 0 516 436 B1, and consequently will not be described in more detail in the text which follows.

Inside the vacuum chamber (5) there is a drum (7), to which the individual substrates (1) that are to be coated are secured. Furthermore, the magnetron sputtering device illustrated in this exemplary embodiment has four sputtering electrode units (10 a, 11 a), as well as a pump (9) and two microwave generators (8), distributed over its circular wall (6). It has been found that the installation described in EP 0 516 436 B1 is eminently suitable for coating a substrate in accordance with the invention, but the process is not restricted to this specific installation, but rather can also be carried out on other sputtering installations.

In a preferred embodiment for the production of blue filters with metal oxide layers, a plurality of substrates (1) are placed onto the drum (7) inside the vacuum chamber.

To coat these substrates (1) with an alternating layer system made up of $ZrO_2$ with a high refractive index and $SiO_2$ with a low refractive index, with the first $ZrO_2$ layer having a thickness of approx. 93.3 nm, Zr atoms are introduced into the vacuum chamber (5) by sputtering of the Zr targets (10 b), and these Zr atoms react with the reactive oxygen gas that has been admitted from the microwave generators (8) to form $ZrO_2$, forming a first sublayer of the functional layer at a coating rate of 14.1 nm of $ZrO_2$/min after 205 s. This is followed, for a short period of 4 s, by reactive sputtering of Si atoms from the Si targets (11 b). The $SiO_2$ which is formed is deposited as an intermediate layer, at a coating rate of 25.7 nm of $SiO_2$/min, on the first $ZrO_2$ functional layer applied.

The short coating duration of just 4 s in this case for the application of the intermediate layer of $SiO_2$ results in a calculated thickness of the intermediate layer of 1.7 nm.

Then, Zr from the Zr targets (10 b) is then sputtered again in a reactive atmosphere for 192 s to produce the as yet absent second half of the first functional layer.

In the next step, a further functional layer with a low refractive index is applied. This layer consists of silicon oxide, which is reactively sputtered into the vacuum chamber (5) from the Si targets (11 b) as Si atoms with a coating rate of 25.7 nm of $SiO_2$/min. This $SiO_2$ is likewise deposited on the layers that have previously been applied. In this step too, the duration of the coating operation depends on the thickness of the layer which is to be applied.

It is obvious that the functional layer formed from $SiO_2$, if desired, can also be split by a very thin intermediate layer formed from $ZrO_2$.

Depending on the particular application, it may be necessary to apply a plurality of alternating layer systems to achieve the intended optical effect of an alternating layer system, e.g. of a blue filter. It is also quite obvious for a plurality of layers to be divided in this manner within an alternating layer system of this type.

Figure 2:
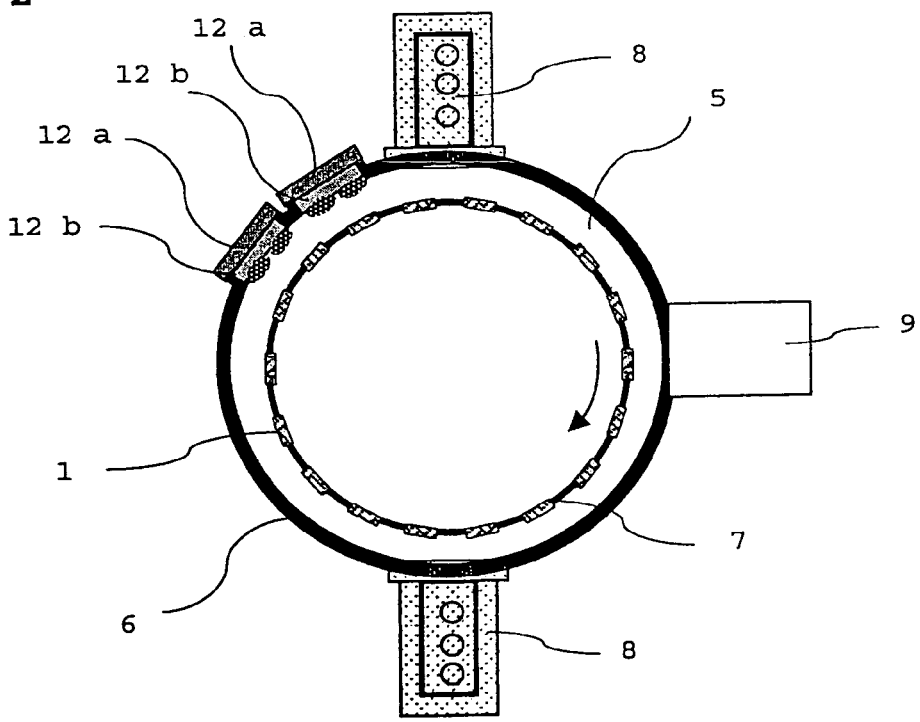
FIG. 2 diagrammatically depicts a magnetron sputtering device for coating substrates with Cr.

FIG. 2 shows a further embodiment of a magnetron sputtering installation which is used to produce chromium layers in accordance with the invention on substrates for lithographic processes. In terms of its structure, it corresponds to the magnetron sputtering installation shown in FIG. 1, but in this case has only two sputtering electrode units (12 a).

The substrates (1) are provided on the drum (7) inside the vacuum chamber (5). To apply a first functional layer of chromium to a substrate (1) Cr atoms are introduced into the vacuum chamber (5) by metallic sputtering of the Cr targets (12 b).

In this respect, it is crucial that there is no oxygen in the vacuum chamber (5) and that no oxygen is supplied. The sputtering process is carried out until the desired thickness of the chromium layer, in this case 30 nm, has been reached. Then, the sputtering electrode units (12 a) are switched off and the microwave generators (8) are briefly activated, resulting in the formation of an oxygen plasma in the vacuum chamber (5), which partially oxidizes the freshly sputtered metallic chromium surface. The thickness of the oxide layer formed is so thin that it has no influence on the spectral properties, in particular the reflection properties, of the mirror layer.

After this operation, the microwave generators (8) are switched off and the sputtering electrode units (12 a) are activated again, so that a further layer of chromium of approx. 30 nm is applied by metallic sputtering of the Cr targets (12 b). This procedure is repeated until the total desired thickness of 270 nm has been reached.

Figure 3:
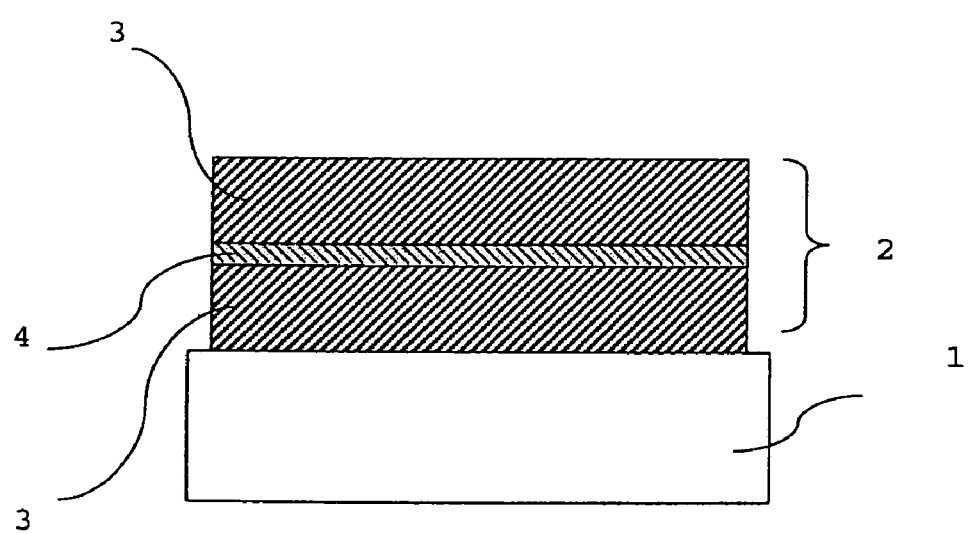
FIG. 3 diagrammatically depicts a cross section through a layer system in accordance with one embodiment of the invention.

FIG. 3 diagrammatically depicts a substrate which has been coated with a functional layer (2) in accordance with the process described above. In this case, a first half of a functional layer (3) has been applied to the substrate (1), followed by interruption with an intermediate layer (4), and then the second half of a functional layer (3) has been applied to the intermediate layer (4). Depending on the particular application and on the stipulated optical design, it is quite obvious for a plurality of functional layers (2), including different functional layers, which have been divided in this manner to be applied on top of one another.

The invention claimed is:

1. A process for coating a substrate with a functional metal layer, comprising the steps of:
   providing the substrate and a layer starting material in a vacuum system;
   sputtering the layer starting material on the substrate to define a first sub-layer of the functional metal layer;
   interrupting the sputtering at least once to produce a metal oxide intermediate layer on the first sub-layer, the metal oxide intermediate layer being different than the functional layer and having a thickness of 0.1 to 20 nm; and
   continuing sputtering the layer starting material after the metal oxide intermediate layer is produced to define a second sub-layer of the functional metal layer, wherein the metal oxide intermediate layer increases the reflectance of the functional metal layer.

2. The process for coating a substrate as claimed in claim 1, wherein the sputtering comprises magnetron sputtering of the layer starting material.

3. The process for coating a substrate as claimed in claim 1, further comprising repeating the sputtering, interrupting, and continuing steps with different layer starting materials so that a plurality of functional metal layers is applied as an alternating layer system comprising first functional metal layers with a low refractive index and a second functional metal layers with a high refractive index.

4. The process for coating a substrate as claimed in claim 3, wherein the first functional metal layer has a first metal oxide intermediate layer with a high refractive index and/or the second functional metal layer has a second metal oxide intermediate layer with a low refractive index.

5. The process for coating a substrate as claimed in claim 4, wherein the first and second metal oxide intermediate layers have a thickness of 0.5 to 10 nm.

6. The process for coating a substrate as claimed in claim 1, wherein the layer starting material comprises a pure metal target.

7. The process for coating a substrate as claimed in claim 6, wherein the interrupting step comprises introducing an oxygen-rich microwave plasma into the vacuum chamber so that a surface of the first sub-layer of the functional metal layer is oxidized.

8. The process for coating a substrate as claimed in claim 7, wherein the pure metal target comprises chromium.

9. The process for coating a substrate as claimed in claim 1, further comprising locating a plurality of substrates on a drum inside the vacuum chamber and rotating the drum so that the plurality of substrates rotate past a plurality of targets comprising the layer starting material and an oxygen source.

10. A process for coating a substrate with a functional metal layer, comprising the steps of:
    providing the substrate and a layer starting material in a vacuum system;
    sputtering the layer starting material on the substrate to define a first sub-layer of the functional metal layer;
    interrupting the sputtering at least once to produce a metal oxide intermediate layer on the first sub-layer, the metal oxide intermediate layer being different than the functional layer and having a thickness of 0.1 to 20 nm;
    continuing sputtering the layer starting material after the metal oxide intermediate layer is produced to define a second sub-layer of the functional metal layer, wherein the metal oxide intermediate layer increases the transmittance and/or reflectance of the functional metal layer; and
    repeating the sputtering, interrupting, and continuing steps with different layer starting materials so that a plurality of functional metal layers is applied as an alternating layer system comprising first functional metal layers with a low refractive index and second functional metal layers with a high refractive index,
    wherein the first functional metal layer has a first metal oxide intermediate layer with a high refractive index and/or the second functional metal layer has a second metal oxide intermediate layer with a low refractive index, and
    wherein the first functional metal layer and the second metal oxide intermediate layer consist of $SiO_2$ by virtue of silicon being sputtered in a reactive atmosphere, and the second functional metal layer and the first metal oxide intermediate layer consist of $ZrO_2$ by virtue of zirconium being sputtered in a reactive atmosphere.

11. A process for coating a substrate with a functional metal layer, comprising the steps of:
    sputtering a layer starting material on a substrate in a vacuum chamber to define a first sub-layer of the functional metal layer;
    interrupting the sputtering of the layer starting material after forming the first sub-layer;
    introducing an oxygen-rich microwave plasma into the vacuum chamber so that a surface of the first sub-layer of the functional metal layer is oxidized; and
    continuing sputtering of the layer starting material after the metal oxide intermediate layer is produced to define a second sub-layer of the functional metal layer, wherein the metal oxide intermediate layer increases the reflectance of the functional metal layer.

12. The process for coating a substrate as claimed in claim 11, wherein the sputtering comprises magnetron sputtering of the layer starting material.

13. The process for coating a substrate as claimed in claim 11, wherein the layer starting material comprises a pure metal target.

14. The process for coating a substrate as claimed in claim 13, wherein the pure metal target comprises chromium.

15. The process for coating a substrate as claimed in claim 11, wherein the metal oxide intermediate layer increases the transmittance of the functional metal layer.

* * * * *